United States Patent
Bruhn et al.

(10) Patent No.: US 9,656,299 B2
(45) Date of Patent: May 23, 2017

(54) METHOD AND CIRCUIT ARRANGEMENT FOR DETERMINING A WORKING RANGE OF AN ULTRASONIC VIBRATING UNIT

(71) Applicant: Weber Ultrasonics GmbH, Karlsbad-Ittersbach (DE)

(72) Inventors: Xenia Bruhn, Karlsruhe (DE); Ralf Broszeit, Pforzheim (DE)

(73) Assignee: Weber Ultrasonics GmbH, Karlsbad-Ittersbach (DE)

( * ) Notice: Subject to any disclaimer, the term of this patent is extended or adjusted under 35 U.S.C. 154(b) by 77 days.

(21) Appl. No.: 14/426,854

(22) PCT Filed: Sep. 9, 2013

(86) PCT No.: PCT/EP2013/068556
§ 371 (c)(1),
(2) Date: Mar. 9, 2015

(87) PCT Pub. No.: WO2014/037550
PCT Pub. Date: Mar. 13, 2014

(65) Prior Publication Data
US 2015/0246373 A1 Sep. 3, 2015

(30) Foreign Application Priority Data
Sep. 10, 2012 (DE) .......................... 10 2012 215 994

(51) Int. Cl.
*G01R 27/02* (2006.01)
*B06B 1/02* (2006.01)
(Continued)

(52) U.S. Cl.
CPC .......... *B06B 1/0207* (2013.01); *B06B 1/0261* (2013.01); *B23K 20/10* (2013.01);
(Continued)

(58) Field of Classification Search
CPC . B06B 1/0207; B06B 1/0261; B06B 2201/40; G01R 27/02; G01R 31/2829; B23K 20/01
(Continued)

(56) References Cited

U.S. PATENT DOCUMENTS 4,849,872 A 7/1989 Gassler
4,879,528 A 11/1989 Gotanda
(Continued)

FOREIGN PATENT DOCUMENTS

EP 1369185 12/2003

*Primary Examiner* — Billy Lactaoen
(74) *Attorney, Agent, or Firm* — Volpe and Koenig, P.C.

(57) ABSTRACT

Provided is a method for determining an operating range of an ultrasonic vibrating unit (7), which ultrasonic vibrating unit (7) is supplied with electrical power by a generator (2) via an output (2*a*) and is excited to vibrate ultrasonically, wherein at least constituent parts of the ultrasonic vibrating unit (7), preferably an ultrasonic transducer (8) contained therein, and constituent parts of the generator (2), preferably a matching network (2*b*) on the output side, form a tuned circuit (2*c*, 2*d*). The method is characterized in that a measuring circuit (3) is connected upstream of the output (2*a*) of the generator (2), via the measuring circuit (3), a voltage (U) is applied to the tuned circuit, and by the measuring circuit (3), at least the phase, preferably magnitude and phase, of an impedance of the tuned circuit are measured, and at least the phase, preferably the phase and magnitude, of the impedance are evaluated in order to determine the working range. The invention further relates to a circuit arrangement for carrying out the aforementioned method.

16 Claims, 7 Drawing Sheets (51) Int. Cl.
*B23K 20/10* (2006.01)
*G01R 31/28* (2006.01)

(52) U.S. Cl.
CPC .......... *G01R 27/02* (2013.01); *B06B 2201/40* (2013.01); *G01R 31/2829* (2013.01)

(58) Field of Classification Search
USPC .......................................... 342/511; 324/511
See application file for complete search history.

(56) References Cited

U.S. PATENT DOCUMENTS

| | | |
|---|---|---|
| 4,973,876 A | 11/1990 | Roberts |
| 5,121,023 A * | 6/1992 | Abel ...................... A61C 17/20 310/316.01 |
| 5,892,315 A | 4/1999 | Gipson et al. |
| 2002/0049551 A1* | 4/2002 | Friedman ....... A61B 17/320068 702/65 |
| 2010/0102672 A1 | 4/2010 | Hoffman et al. |
| 2011/0241576 A1* | 10/2011 | Paschke ................. A61C 17/20 318/3 |

* cited by examiner

METHOD AND CIRCUIT ARRANGEMENT FOR DETERMINING A WORKING RANGE OF AN ULTRASONIC VIBRATING UNIT

BACKGROUND

The invention relates to a method for determining an operating range of an ultrasonic vibration device, which ultrasonic vibration device is supplied with electrical energy by a generator via an output and is induced to vibrate ultrasonically, wherein at least components of the ultrasonic vibration device, preferably an ultrasonic transducer contained in said ultrasonic vibration device, and components of the generator, preferably an output-side matching network, form a tuned circuit.

Furthermore, the invention relates to a circuit arrangement for performing a method according to the invention, having an ultrasonic vibration device, which ultrasonic vibration device is connected to a generator and can be supplied with electrical energy by the generator via an output and can be induced to vibrate ultrasonically, wherein at least components of the ultrasonic vibration device, preferably an ultrasonic transducer contained in said ultrasonic vibration device, and components of the generator, preferably an output-side matching network, form a tuned circuit.

Ultrasonic vibration devices (also referred to as ultrasonic vibration systems) are used not only in the field of ultrasonic cleaning but also in other fields of technology, such as ultrasonic welding or cutting, for example. In addition to an ultrasonic generator, which induces the vibrations by excitation using a high-frequency electrical signal, a vibration device is necessary, which vibration device comprises an ultrasonic transducer (for example a piezo transducer) or interacts with same, which ultrasonic transducer converts electrical oscillations into mechanical vibrations. Furthermore, the vibration device additionally comprises the actual ultrasonic vibrator or emitter, or a sonotrode, which outputs the actual ultrasonic vibrations to a medium or a tool.

Vibration devices or ultrasonic transducers and the ultrasonic generator with its electrical matching network together form an electromagnetic tuned circuit. Depending on the area of application, the vibration devices can be configured in various geometric shapes and sizes and in various materials, wherein they have different operating ranges due to their shape and composition and the modified properties of said tuned circuit concomitant with said shape and composition, to which the required optimum operating frequency relates. These operating ranges can be defined or limited in the frequency domain by resonant points (resonant frequencies) in the vibration behavior, so-called parallel and series resonance. When the resonant points are known, along with the generator and vibration device, the optimum operating range of an ultrasonic device equipped therewith can be determined.

If it is necessary to exchange the vibration device, a new vibration device or the corresponding tuned circuit generally does not have the same starting frequency or the same operating range as the vibration device used previously. "Starting frequency" is to be understood as that excitation frequency of the generator at which the vibration device is initially excited during start-up of a corresponding ultrasonic device. The starting frequency should in particular be chosen such that the device or the vibration device is not damaged. In addition, changes to external parameters, for example large temperature fluctuations, result in a shift of resonant points of the vibration device or of the entire tuned circuit. Without knowledge of the resonant points, the operating range of the entire apparatus is not known.

Accordingly, in the event of an exchange or said changes, the starting frequency must often be recalculated and the operating range correspondingly reset. For this purpose, appropriate measuring tools, such as impedance analyzers, are necessary; however, they are expensive and complex to operate. The ultrasonic vibration device cannot be properly used without appropriate adjustment, however.

One possibility known from the prior art for determining the resonant points on-site and, furthermore, for ensuring correct operation of the vibration device consists in calculating the resonant points using a frequency scan of a frequency range with noise emission in the idling state, that is to say with freely vibrating vibration device without medium or pressure and correspondingly without damping. For this purpose, the vibration device has a pulse-width-modulated signal applied thereto at low generator output, wherein a particular frequency range is scanned in the idling state. By analyzing the power, the phase and the current passage, the resonant points are calculated in order to determine the operating range. However, the noise emission in the idling state firstly requires a very high volume and, secondly, the vibration device can be damaged by excitation at too high a power and, as a result, become inoperative. Risk to the operating personnel is not ruled out, either.

SUMMARY

The invention is therefore based on the object of being able to determine the operating range of a vibration device rapidly and simply while avoiding the aforesaid disadvantages.

The object is achieved by a method and a circuit arrangement for performing said method including one or more features of the invention. Advantageous developments are respective subject matter of the claims.

According to the invention, a method for determining an operating range of an ultrasonic vibration device, which ultrasonic vibration device is supplied with electrical energy by a generator via an output and is induced to vibrate ultrasonically, wherein at least components of the ultrasonic vibration device, preferably an ultrasonic transducer contained in said ultrasonic vibration device, and components of the generator, preferably an output-side matching network, form a tuned circuit, characterized in that a measuring circuit is connected upstream of the output of the generator, a voltage is applied to the tuned circuit via the measuring circuit, at least the phase, preferably the magnitude and phase, of an impedance of the tuned circuit is measured by means of the measuring circuit, and at least the phase, preferably the magnitude and phase, of the impedance is evaluated to determine the operating range.

The impedance is the quotient of complex AC voltage and complex alternating current and, to a person skilled in the art, includes the combination of two statements: it indicates the ratio of the amplitude of sinusoidal AC voltage to sinusoidal alternating current and it indicates the phase shift between said two variables. The latter is referred to as "phase of the impedance" in the present case.

According to the invention, a circuit arrangement for performing a method according to the invention, having an ultrasonic vibration device, which ultrasonic vibration device is connected to a generator and can be supplied with electrical energy by the generator via an output and can be induced to vibrate ultrasonically, wherein at least components of the ultrasonic vibration device, preferably an ultrasonic transducer contained in said ultrasonic vibration device, and components of the generator, preferably an output-side matching network, form a tuned circuit, characterized in that a measuring circuit is connected upstream of the output of the generator, wherein a voltage can be applied to the tuned circuit via the measuring circuit, wherein the phase, preferably the magnitude and phase, of an impedance of the tuned circuit can be measured by means of the measuring circuit, and wherein the circuit arrangement is also designed to evaluate at least the phase, preferably the magnitude and phase, of the impedance for the purpose of determining the operating range.

In the context of the present description, the ultrasonic transducer contained in the ultrasonic vibration device and the output-side matching network of the generator form a tuned electrical circuit. If the actual ultrasonic vibrator or emitter, which influences the behavior of said tuned circuit, is also additionally taken into account, an extended tuned electromechanical circuit results. Both terms are used synonymously in the course of the present description and are generalized to "tuned circuit".

According to the invention, in the context of a type of "prescan", the optimum operating range of the ultrasonic vibration device can be calculated using said measuring circuit and used for later operation in terms of control, without the vibration device itself having to be induced substantially to vibration "in the idling state" for this purpose.

As part of a first development, the invention provides that the measuring circuit is connected to a transformer within the generator. In this case, the measuring circuit can be arranged within the generator itself. However, it may alternatively also be provided that the measuring circuit is arranged outside the generator in order to realize a mobile measuring station.

Particularly preferably, it is provided that the transformer has an inductive coupling on the primary side or secondary side, preferably a primary-side auxiliary winding which, in terms of circuitry, is arranged between tuned circuit and measuring circuit in order to be able to perform the above-mentioned measurements at the tuned circuit. Most preferably, the transformer has, on the primary side, an auxiliary winding in addition to a primary winding, for the end stage (actuation) for the actual RF excitation signal, which auxiliary winding is arranged between tuned circuit and measuring circuit and which is electrically operatively connected to said tuned circuit and measuring circuit. Advantageously, the measuring circuit is arranged on the primary side and the tuned circuit is arranged on the secondary side with respect to the transformer.

However, the invention is not restricted in any way to an inductive coupling to said transformer; rather, another development of the invention provides that the voltage is applied via an inductive coupling to another component, in particular an inductance or inductor (coil), within the generator is applied or in electrical operative connection to the generator. With regard to a circuit arrangement according to the invention, provision can correspondingly be made that the measuring circuit is connected to an inductive component within the generator or is electrically operatively connected to the generator, preferably inductively coupled. In this context, "inductively coupled" is to be understood as an electromagnetic operative connection by utilizing inductive properties of the appropriate components, which is a routine matter to a person skilled in the art.

Preferably—but without being restrictive—the measuring circuit can be designed with operational amplifiers or impedance converters, which is discussed in more detail below. The design of the circuit arrangement according to the invention is connected to an expenditure which is only slight in terms of circuitry, especially as the mentioned transformer is already present in the case of commercially available ultrasonic generators.

In order to record and evaluate the signals occurring, provision is preferably made that a signal processing unit for reading signal profiles of magnitude and phase of the impedance of the tuned circuit as a function of the frequency and/or a data processing unit for evaluating the measured signal profiles are/is assigned to the tuned circuit. The signal processing unit can furthermore be designed to generate a DC voltage which is proportional to the phase of the impedance. The data processing unit is preferably set up to automatically detect and/or display the operating range on the basis of the measured signal profiles. Both the signal processing unit and the data processing unit can be arranged or designed within the generator itself. An external arrangement of said units is also possible in order to enable mobile evaluation, wherein the signals to be processed or evaluated can be tapped at a corresponding signal output of the generator. One possibility for the evaluation is the use of a commercially available oscilloscope.

In order to excite the tuned circuit, the invention particularly preferably provides that the voltage is applied to the tuned circuit via an inductive primary-side or secondary-side coupling to a transformer within the generator, preferably via a primary-side auxiliary winding of the generator. In this connection, preferably magnitude and/or phase of the impedance are measured via the inductive coupling to the transformer, preferably the primary-side auxiliary winding of the transformer. Preferably, a relatively small voltage of the order of magnitude of 1-50 V is applied, preferably approximately 1 to 15 V, most preferably 5 V. In this case, the voltage is applied directly via the inductive coupling or the auxiliary winding to the tuned circuit or the vibration device, not via the end stage or the corresponding primary-side transformer winding. Accordingly, it is particularly advantageous to measure the impedance of the tuned circuit on the primary side, wherein the measurement is only done using said transformer auxiliary winding and completely without application of the end stage. As a result of this, the vibration device is not induced to vibrate—as known from the prior art. The measurement therefore takes place without noise and without any danger to operators and equipment, which has already been mentioned.

The measuring circuit also preferably has a frequency input to which a frequency f can be applied, at which frequency the measurement using the measuring circuit is to take place. As part of a configuration, it is furthermore preferably provided that the magnitude and phase of the impedance of the tuned circuit are measured or determined via the primary-side auxiliary winding of the transformer. For the purpose of measurement or for corresponding signal processing and evaluation, the measured signals are preferably tapped at corresponding signal outputs of the measuring circuit by means of a suitably designed signal processing unit. This can be specifically designed to generate a DC voltage which is proportional to the measured phase of the impedance of the tuned circuit for the purpose of evaluation.

After this, the measured or tapped signals are preferably transmitted from the signal processing unit to a data processing unit, wherein the signals are preferably evaluated on the basis of a DC voltage which is proportional to the phase of the impedance, as mentioned above. Depending on the magnitude and/or the mathematical sign of the phase, the data processing unit can detect in which section of its operating range the tuned circuit or the vibration device is. An impedance phase of 0° (voltage and current in phase) indicates a resonant point, for example. Thus, in the case of a sequence of predefined fundamental frequencies in the course of a scan, the corresponding resonant points can be detected. The impedance measurement makes it possible to detect and to differentiate whether a vibration device is even connected (without vibration device, there is a constant phase with a relatively high magnitude) or whether a short circuit has occurred in the supply lines (phase is 0° independently of the set frequency). The arrangement can therefore be used for simple fault finding.

Preferably, this scan takes place as so-called prescan before the actual start-up of the ultrasonic device.

The measurements of the impedance of the tuned circuit do not have to be performed using an external impedance analyzer as part of an appropriate configuration of the invention, but rather may be performed using the present generator since said transformer is always present in the case of the ultrasonic generators used and merely needs to have an auxiliary winding added to its primary side.

The method can additionally or alternatively be used during continuous operation in order to achieve continuous monitoring of the tuned circuit and hence of the vibration device. In this connection, the data processing unit preferably supplies a corresponding control signal to the rest of the device, in particular the generator, in order to stop or to limit the power supply to the vibration device if the monitoring system indicates a malfunction. Damage before or during start-up is avoided by the lack of excitation of the vibration device, and noise pollution is prevented.

BRIEF DESCRIPTION OF THE PREFERRED DRAWINGS

Further details and features of the invention can be seen from the following description of an exemplary embodiment with reference to the drawing, in which.

DETAILED DESCRIPTION OF THE PREFERRED EMBODIMENTS

Figure 1:
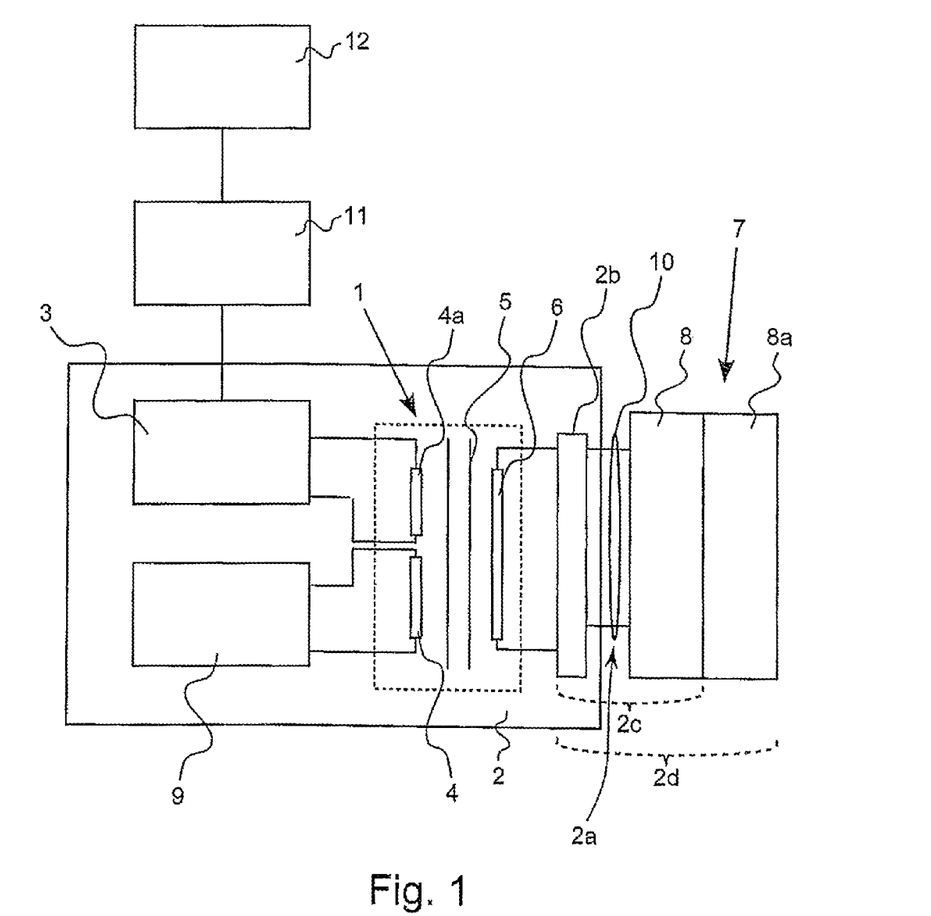
FIG. 1 shows an equivalent circuit diagram of a transformer with a circuit arrangement according to the invention for performing the method according to the invention.

FIG. 1 illustrates the equivalent circuit diagram of an ultrasonic vibration system which comprises, according to an embodiment of the invention, a transformer 1 (dashed box) which is arranged within an (ultrasonic) generator 2. The transformer 1 is also connected to a measuring circuit 3. A primary-side transformer winding 4 is operatively connected via a ferrite core 5 to an inductance (secondary-side transformer winding) 6, wherein the transformer 1 also has an additional primary-side auxiliary winding 4a in the shown exemplary embodiment.

The inductance 6 on the secondary side of the transformer 1 is electrically connected to an ultrasonic transducer 8, which is connected by means of a cable 10 to an output 2a of the generator 2 and, together with the inductance 6 and a routinely present matching network 2b of the generator 2, forms a tuned electrical circuit 2c. The ultrasonic transducer 8, for example a piezo transducer, converts electrical energy from the generator 2 into mechanical energy. The ultrasonic vibrator 8a itself is connected downstream of said ultrasonic transducer, wherein ultrasonic transducer 8 and ultrasonic vibrator 8a form an ultrasonic vibration device 7, with the result that the ultrasonic vibrator 8a, for example an ultrasonic cutting blade, can be induced to mechanically vibrate by means of the ultrasonic transducer 8. Together with the ultrasonic vibrator 8a, the components 2b, 8 of the tuned electrical circuit 2c form an extended tuned electromechanical circuit, which is denoted in FIG. 1 with the reference sign 2d. Electrical energy can be conducted to the tuned circuit 2c, 2d by means of the transformer 1 or of the generator 2, wherein, during regular operation, the electrical excitation signals of desired frequency are amplified by an end-stage (excitation) 9, which is connected via said primary-side transformer winding 4 (end-stage winding) to the transformer 1.

The generator 2 and, in particular here, the measuring circuit 3 is connected to a signal processing unit 11 for tapping the electrical signals of the tuned circuit 2c, 2d and to a data processing unit 12 for further evaluation of the tapped signals. This data processing unit comprises suitable processor means, such as in a commercially available computer with appropriate evaluation software, or an oscilloscope. Signal processing unit 11 and data processing unit 12 are arranged outside of the generator 2 in the shown embodiment.

It should be noted at this point that the invention is not restricted in principle to coupling the measuring circuit 3 via a primary-side auxiliary winding to the transformer 1. Alternatively, a secondary-side auxiliary winding may also be used, or, in general, an inductive coupling of the measuring circuit to the transformer or to another inductively effective component (not shown) may be realized, cf. FIG. 2.

Figure 2:
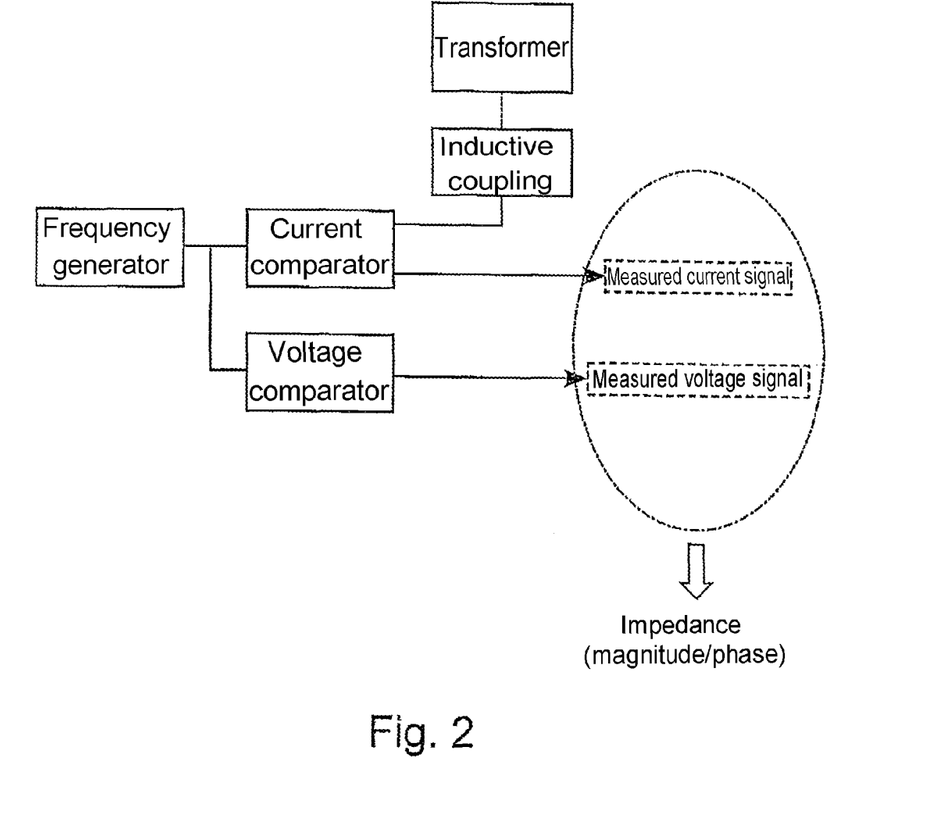
FIG. 2 shows a schematic functional circuit diagram of a circuit arrangement according to the invention.

FIG. 2 shows a basic functional circuit diagram of a measuring circuit which can be used within the scope of the invention. The transformer which has already been mentioned and to which the rest of the measuring circuit is inductively coupled is illustrated. The circuit comprises a current comparator designed in any way and a voltage comparator likewise designed in any way, which are connected to a frequency generator. The current comparator supplies a measured current signal, and the voltage comparator supplies a measured voltage signal. The two measured signals are fed to an evaluator in order to determine phase and/or magnitude of the impedance of the tuned circuit (cf. FIG. 1) coupled to the transformer.

Figure 3:
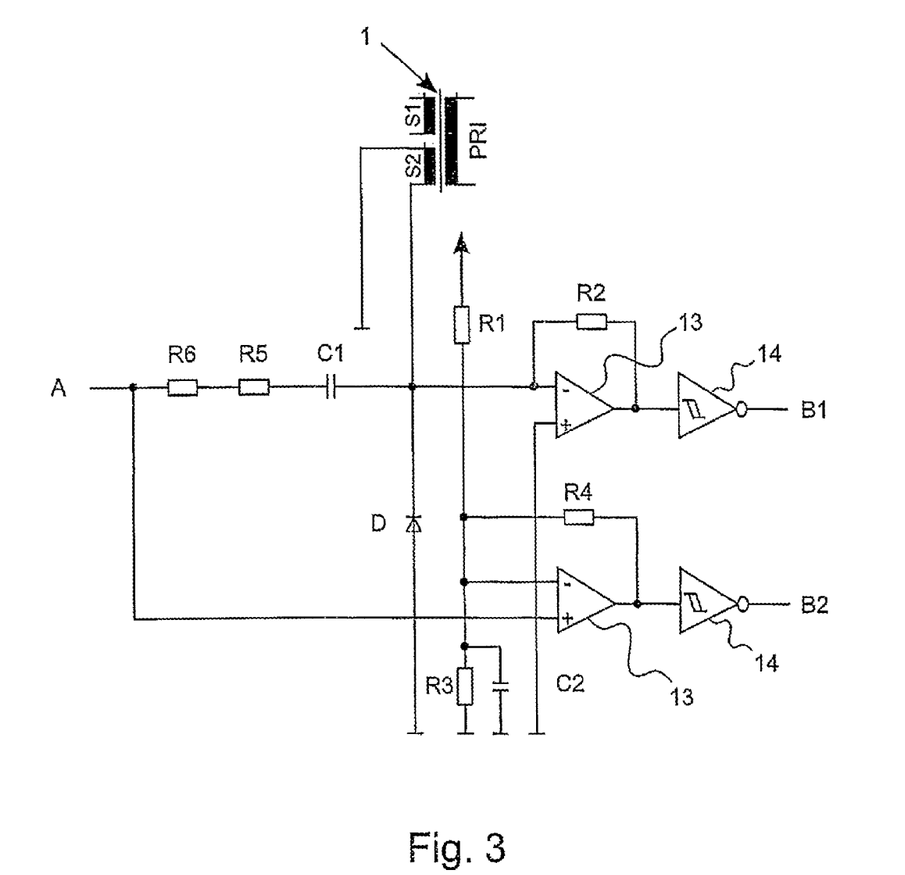
FIG. 3 shows a detailed circuit diagram of a possible measuring circuit as part of the circuit arrangement according to the invention.

FIG. 3 illustrates a detailed circuit diagram of a measuring circuit 3 as part of a circuit arrangement according to the invention, into which the concept according to FIG. 2 can be translated. The figure shows an exemplary circuit which is constructed using operational amplifiers. A signal input A is provided, via which a particular frequency can be applied (cf. "frequency generator" in FIG. 2) to the measuring circuit 3, at which frequency the measurement at the tuned circuit is to be performed. As part of a (pre)scan, said frequency can be varied, in particular continuously. The measuring circuit 3 also has a number of resistors, which are denoted by R1 to R6 in FIG. 3. A diode D and capacitors C1, C2 are also provided. The measuring circuit 3 is connected via a node K to the primary-side transformer auxiliary winding 4a (cf. FIG. 1) and thus is connected in terms of signals to the rest of the circuit arrangement or to the tuned circuit. Two operational amplifiers 13 are also arranged in the circuit diagram according to FIG. 3, in each case an inverted Schmitt trigger 14 being connected downstream of said operational amplifiers, with the result that a so-called trans-impedance converter results as current comparator. As measured signals or output signals of the circuit 3, a signal corresponding to the phase of the current flowing in the tuned circuit can be tapped via an output B1 and a signal corresponding to the phase of the voltage present in the tuned circuit can be tapped via an output B2.

As a person skilled in the art readily detects, the invention is not restricted in any way to the use of the circuit according to FIG. 3. Any circuit which supplies comparable measured results can alternatively be used within the scope of the invention. An exemplary alternative realization of the circuit 3 with impedance converters (for example AD5933 or AD5934) is likewise possible.

Figure 4:
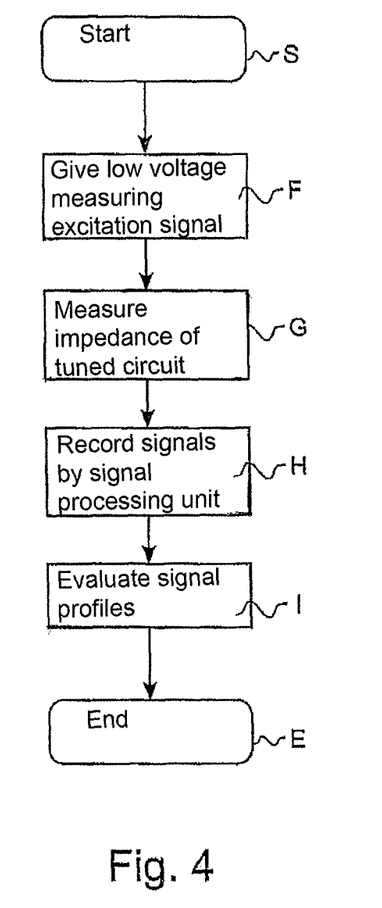
FIG. 4 shows a flow chart of a configuration of the method according to the invention.

FIG. 4 illustrates a flow chart of a method according to the invention. According to step F, once the method has started, a measuring excitation signal with low voltage is given, via the input A of the measuring circuit 3 according to FIG. 3, directly to the tuned circuit 2c, 2d (cf. FIG. 1), that is to say via the auxiliary winding 4a of the transformer 1 and via the components of the generator 2 which are connected downstream, to the ultrasonic transducer 8. The measured signal is supplied at a (preferably variable) frequency f via the frequency input A to the circuit arrangement, wherein only an electrical voltage U with low magnitude is applied to the auxiliary winding 4a. The voltage U is selected from a voltage value range of approximately 1-50 V and in the exemplary embodiment described here is preferably U=5 V. Since the voltage is given to the tuned circuit 2c, 2d via the auxiliary winding 4a, there is no voltage at the end stage 9. Thus, no amplification of an excitation signal supplied via the end stage 9 to the ultrasonic transducer 8 takes place either. The tuned circuit 2c, 2d is consequently only excited to a low level for the purpose of impedance measurement, without a noticeable conversion of electrical energy into mechanical vibration energy. Hence, there is no discernible excitation of the vibration device 7 as such via the ultrasonic transducer 8 either.

In a subsequent step G, the impedance of the tuned circuit is measured using the measuring circuit 3, wherein a measured signal for the current is tapped at the output B1 and a measured signal for the voltage is tapped at the output B2, cf. FIG. 2.

These signals are then recorded by means of the signal processing unit 11 in step H. The measured and recorded signal profiles are then evaluated in step I by means of the data processing unit 12 on the basis of a DC voltage which is proportional to the phase of the impedance (phase difference between current and voltage). By way of example, a commercially available oscilloscope can be used for simple and rapid evaluation.

Figure 5:
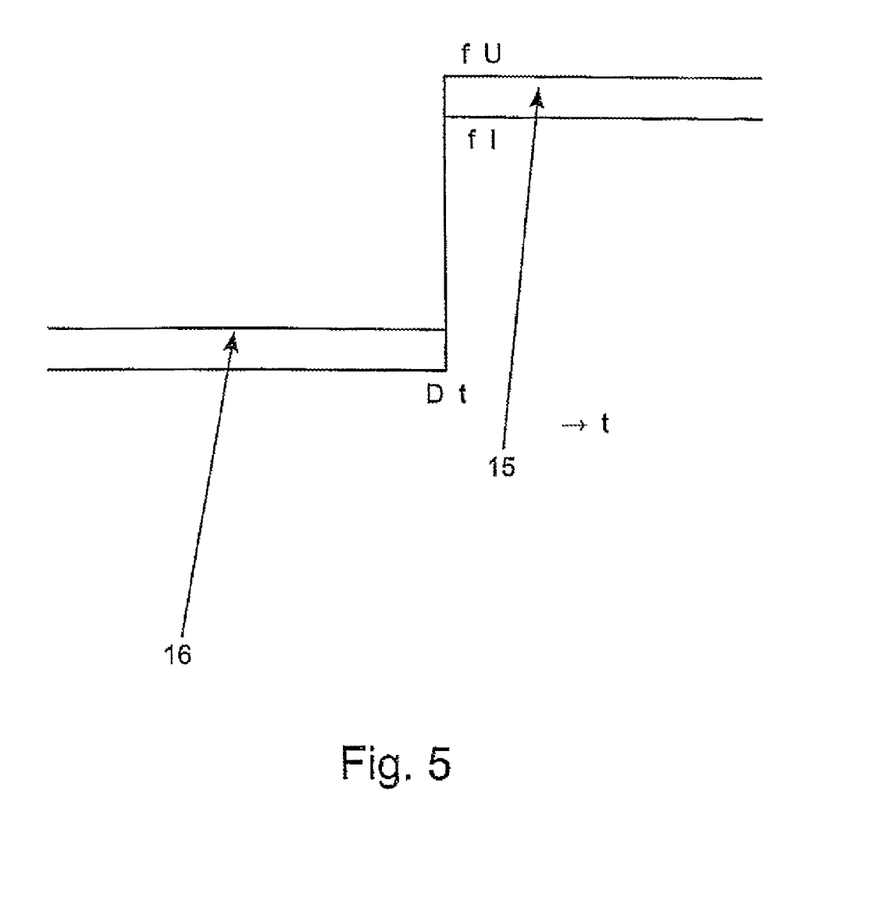
FIGS. 5-7 show examples of measured signal profiles in the case of evaluation of measurements within the scope of the method according to the invention.
Figure 6:
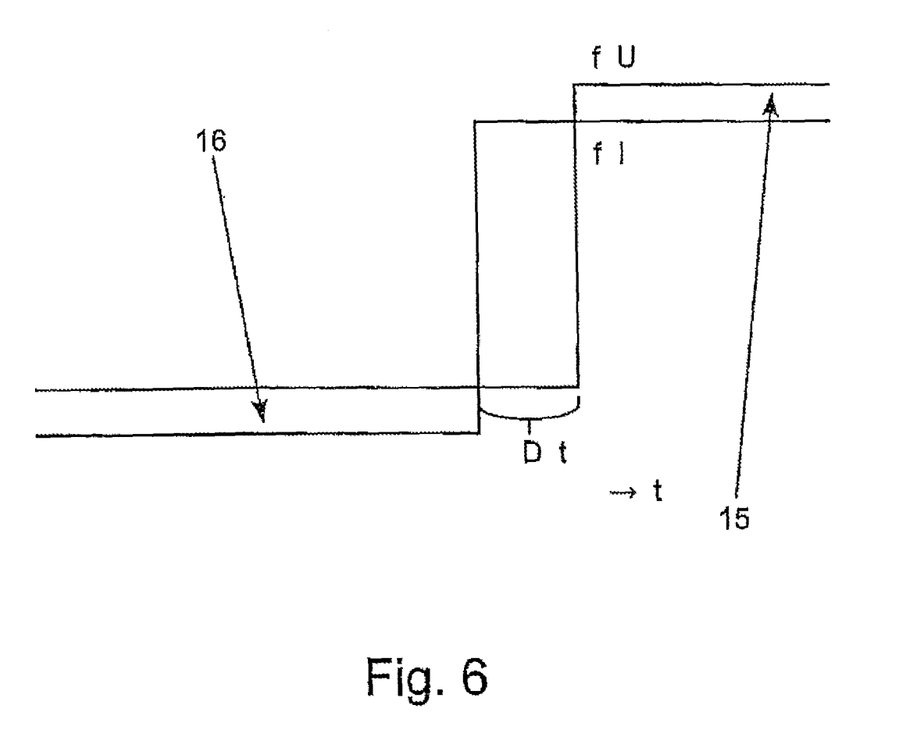
Figure 7:
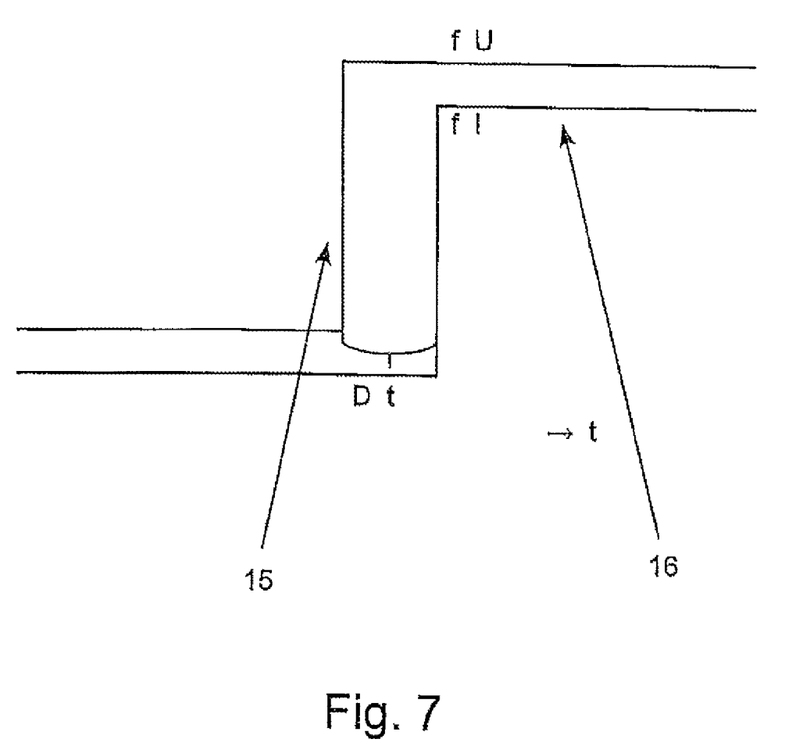

FIGS. 5 to 7 show exemplary evaluations of said signals or signal profiles by means of an oscilloscope as signal processing unit 11 and data processing unit 12.

In each case a first line 15 appertains to an evaluation of the voltage signal; a second line 16 appertains to the current signal. In this connection, in each case the relative phase relation between the zero crossings of the signals 15, 16 should be taken into account. The relative phase relation, which corresponds between phase difference Dt, gives an indication of which point in the operating range of the vibration system has been reached, whether a short circuit is present or the vibration device 7 or the associated ultrasonic transducer 8 (cf. FIG. 1) is even connected. The mathematical sign should also be taken into account for this purpose. By way of example, in the range between the resonant points of the series resonance and the parallel resonance (operating range), the phase of the impedance should have a positive mathematical sign and a magnitude which is not zero, wherein the current leads the voltage (cf. FIG. 7). Below the series resonance, a negative phase with a magnitude which is not zero is to be expected. Above the parallel resonance, a phase with a negative mathematical sign and a magnitude which is not zero should likewise be measurable (cf. FIG. 6). In the event of a phase of 0° which is independent of frequency, a short circuit has occurred; in the event of a magnitude of the phase not being equal to zero and a negative mathematical sign, independently of the frequency, the vibration device 7 could be missing or could be wrongly connected (so-called "open end").

The magnitude of the respective phase (current, voltage) can be determined, and hence the phase of the impedance of the tuned circuit 2c, 2d (cf. FIG. 1) can be calculated from the illustrated evaluation, which is preferably performed by the elements 11, 12 according to FIG. 1 and the result of which can then, by open-loop or closed-loop control, retroact on the operation of the entire system according to FIG. 1. By tuning the frequency range and respective application of the mentioned measuring voltage U, the position of the resonant points is calculated, as a result of which the operating range of the vibration device 7 is established in a gentle way and can be used to control the device.

For this purpose, FIG. 5 shows an example of an evaluation at the point of the parallel or series resonance of the tuned circuit. The phase of the impedance, corresponding to a temporal difference Dt of the zero crossings of the signals 15, 16, indicates substantially precisely 0°. The magnitude of the phase should always be zero in the resonant points. In the case of a properly connected vibration system, this state occurs twice over the operating range or at the edges thereof.

By way of example, FIG. 6 illustrates the case in which the voltage signal 15 leads the current signal 16 (negative phase). A negative phase such as this with a magnitude not equal to 0° is to be expected below the series resonance and above the parallel resonance.

FIG. 7 illustrates a view of the frequency range between series and parallel resonance (operating range). Here, the phase has a value >0° in the case of a positive mathematical sign, which means that the current 16 leads the voltage 15.

If signals according to FIG. 5 are measured over all frequencies, a short-circuit case is present, wherein a phase of approximately 0° is then measured, independently of the selected frequency. In the case of a frequency which is below the series resonant frequency or above the parallel resonance of the tuned circuit used, a negative phase with a magnitude which is not equal to zero should in fact be detected when the tuned circuit is functioning (cf. FIG. 6); in contrast, a positive phase which is not equal to zero should be detected between the resonant positions (cf. FIG. 7).

In contrast, FIG. 6 shows the case in which a vibration device is completely missing, if a phase less than 0° is measured over the frequency response, independently of the selected frequency. In contrast, in the case of a correctly connected vibration device, all measured states according to FIGS. 5 to 7 occur at least once.

LIST OF REFERENCE SIGNS

1 Transformer
2 Generator

2a Generator output
2b Matching network
2c Tuned circuit (electrical)
2d Tuned circuit (electromechanical)
3 Measuring circuit
4 Transformer winding
4a Auxiliary winding
5 Ferrite core
6 Inductance
7 Vibration device
8 Ultrasonic transducer
8a Ultrasonic emitter, vibrator; sonotrode
9 End stage
10 Cable
11 Signal processing unit
12 Data processing unit
13 Operational amplifier
14 Inverted Schmitt trigger
15 Current signal
16 Voltage signal
A Input frequency
B1 Output phase current
B2 Output phase voltage
C1-2 Capacitor
D Diode
K Nodes
R1-6 Resistors
F-I Method steps

The invention claimed is:

1. A method for determining an operating range of an ultrasonic vibration device (7), said ultrasonic vibration device (7) is supplied with electrical energy by a generator (2) via an output (2a) and is induced to vibrate ultrasonically, and at least components of the ultrasonic vibration device (7) and components of the generator (2) form a tuned circuit (2c, 2d),
connecting a measuring circuit (3) and an output stage (9) upstream of the output (2a) of the generator (2) to the ultrasonic vibration device, the output stage applying signals to the resonant circuit (2c, 2d) for excitation of the ultrasonic vibration device (7),
applying a voltage (U) to the tuned circuit (2c, 2d) via the measuring circuit (3) while maintaining the output stage (9) in a voltage-free state during application of the voltage (U),
measuring at least a phase of an impedance of the tuned circuit by the measuring circuit (3), and
evaluating at least the phase of the impedance to determine the operating range.

2. The method as claimed in claim 1, wherein the voltage (U) is applied via an inductive coupling within the generator (2) or is applied in electrical operative connection to the generator (2).

3. The method as claimed in claim 1, the voltage (U) is applied to the tuned circuit via an inductive primary-side or secondary-side coupling to a transformer (1) within the generator (2).

4. The method as claimed in claim 2, wherein the phase of the impedance is measured via the inductive coupling.

5. The method as claimed in claim 1, wherein the voltage (U) of an order of magnitude of 1-50 V is applied.

6. The method as claimed in claim 1, wherein the signals measured by the measuring circuit (3) are tapped at signal outputs (B1, B2) of the measuring circuit (3) by a signal processing unit (11) in order to determine the operating range.

7. The method as claimed in claim 6, wherein the measured signals are transmitted from the signal processing unit (11) to a data processing unit (12), in which the signals are evaluated based on a DC voltage which is proportional to the phase of the impedance.

8. A circuit arrangement, comprising having an ultrasonic vibration device (7), said ultrasonic vibration device (7) is connected to a generator (2) and is supplied with electrical energy by the generator (2) via an output (2a) and is induced to vibrate ultrasonically, wherein at least components of the ultrasonic vibration device (7) and components of the generator (2) form a tuned circuit (2c, 2d),
a measuring circuit (3) and an output stage (9) are connected upstream of the output (2a) of the generator (2) to the ultrasonic vibration device, the output stage (9) applies signals to the resonant circuit (2c, 2d) for excitation of the ultrasonic vibration device (7), a voltage (U) is applied to the tuned circuit (2a, 2d) via the measuring circuit (3), the phase of an impedance of the tuned circuit (2c, 2d) is measured by the measuring circuit (3), and the circuit arrangement is configured to evaluate at least the phase of the impedance for determining the operating range, wherein the circuit arrangement is constructed such that the output stage (9) is maintained in a voltage-free state during the application of the voltage across the measuring circuit (3).

9. The circuit arrangement as claimed in claim 8, wherein the measuring circuit (3) is connected to a transformer (1) or an inductive component within the generator (2) or is electrically operatively connected to the generator (2).

10. The circuit arrangement as claimed in claim 9, wherein the transformer (1) has an inductive coupling on a primary side or secondary side which, in terms of circuitry, is arranged between tuned circuit (2c, 2d) and measuring circuit (3).

11. The circuit arrangement as claimed in claim 10, wherein the measuring circuit (3) is arranged on the primary side and the tuned circuit (2c, 2d) is arranged on the secondary side with respect to the transformer (1).

12. The circuit arrangement as claimed in claim 8, further comprising a signal processing unit (11) for reading signal profiles, supplied by the measuring circuit (3), of the measured variables assigned to the tuned circuit (2c, 2d) and generates a DC voltage which is proportional to the phase of the impedance.

13. The circuit arrangement as claimed in claim 8, further comprising a data processing unit (12) for evaluating the measured signal profiles assigned to the tuned circuit (2c, 2d) and set up to at least one of detect or to display the operating range on the basis of the measured signal profiles.

14. The method as claimed in claim 1, wherein an ultrasonic transducer is contained in the ultrasonic vibration device, and the generator includes an output-side matching network to form the turned circuit, and the method further comprises measuring the phase and a magnitude of the impedance of the tuned circuit; and evaluating the phase and the magnitude of the impedance to determine the operating range.

15. The method of claim 3, wherein the voltage (U) is applied via a primary-side auxiliary winding of the generator.

16. The method of claim 15, wherein the magnitude and a phase of the impedance are measured via the primary-side auxiliary winding.

* * * * *